United States Patent
Venkitachalam et al.

(10) Patent No.: US 6,489,901 B1
(45) Date of Patent: Dec. 3, 2002

(54) VARIABLE DUTY CYCLE RESAMPLING CIRCUITS AND METHODS AND SAMPLE RATE CONVERTERS USING THE SAME

(75) Inventors: Anand Venkitachalam, Pune (IN); Dylan Hester, Austin, TX (US); Joe Welser, Austin, TX (US); Rajendra Datar, Pune (IN); Krishnan Subramoniam, Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/944,738

(22) Filed: Aug. 31, 2001

(51) Int. Cl.$^7$ ................................................. H03M 7/04
(52) U.S. Cl. ........................ 341/61; 341/50; 341/51; 375/326
(58) Field of Search ............................ 341/61; 713/400, 713/503; 370/545, 538; 348/441; 375/326

(56) References Cited

U.S. PATENT DOCUMENTS 5,598,439 A * 1/1997 Wagner .................... 375/326
5,619,270 A * 4/1997 Demmer ................... 348/441
5,621,478 A * 4/1997 Demmer ................... 348/441
6,208,671 B1 * 3/2001 Paulos et al. ............... 341/61
6,226,758 B1 * 5/2001 Gaalaas et al. ............ 713/600

* cited by examiner

Primary Examiner—Michael Tokar
Assistant Examiner—Lam T. Mai
(74) Attorney, Agent, or Firm—James J. Murphy, Esq.; Winstead Sechrest & Minick

(57) ABSTRACT

A sample rate converter 210, 209 includes a filter 210 for processing digital data in response to a clock controlled by a clock enable signal, the filter 210 receiving the digital data at a first sampling rate and outputting digital data at a second sampling rate. Resampler circuitry 209 generates first selected periods of the clock enable signal having a first duty cycle approximating a ratio between the first sampling rate and the second sampling rate. Selectively, selected periods of the clock enable signal are generated having a second duty cycle for minimizing an error accumulated over the first selected periods of the clock enable signal.

21 Claims, 4 Drawing Sheets

VARIABLE DUTY CYCLE RESAMPLING CIRCUITS AND METHODS AND SAMPLE RATE CONVERTERS USING THE SAME

CROSS-REFERENCE TO RELATED APPLICATION

The following co-pending and co-assigned application contains related information and is hereby incorporated by reference: Ser. No. 09/944,736, entitled "ANALOG TO DIGITAL CONVERTERS WITH INTEGRAL SAMPLE RATE CONVERSION AND SYSTEMS AND METHODS USING THE SAME", filed Aug 31, 2001;.

BACKGROUND OF THE INVENTION

1. Field of Invention

The present invention relates in general to mixed analog and digital signal processing and in particular, to synchronous sample rate conversion circuits and methods.

2. Background of Invention

In many applications, converting data from its native analog form into the digital domain for processing, storage and transmission provides the best overall system performance. One well known example is audio processing where analog audio is digitized through analog to digital (A/D) conversion and then processed, for example filtered or compressed, and then stored on a digital storage medium such as a compact disk (CD) or digital video disk (DVD). On playback, the digital data is decompressed, as required, reconverted to analog through digital to analog (D/A) conversion, and finally presented to the end user as audible tones.

According to the Nyquist Theorem, so long as the analog waveform is sampled during A/D conversion at a sampling frequency at least twice as high as the highest frequency component, that waveform can be successively reconstructed during subsequent D/A conversion. In actual practice, oversampling A/D and D/A converters are typically used because of their relative ease in implementation. For example, in an 8× oversampling converter operating on data with a base sampling rate of 44.1 kHz, the data are sampled at a rate of 352.8 kHz. At the higher sampling rate, operations such as anti-aliasing filtering are easier since a substantial amount of the noise power is translated to frequency bands well above the band of the signal of interest.

Sample rate conversion is an additional problem which must be addressed when processing digitized analog data. For example, professional digital audio is typically recorded with a sampling rate of 48 kHz while typical playback devices operate with a base sampling rate of 44.1 kHz. Sample rate conversion, and specifically down-conversion, is therefore required to ensure that the recorded audio properly plays back. There are several existing sample rate conversion techniques, including decimation for lowering the sampling rate and interpolation for increasing the sampling rate. Notwithstanding, these techniques are still subject to some significant disadvantages including the need for substantial silicon area for fabricating the requisite interpolation/ decimation filters, as well as limitations on the ability to convert to fractional sampling rates.

SUMMARY OF INVENTION

The present principles are embodied in circuits and methods for providing accurate, synchronous sample rate conversion. According to one particular embodiment, a sample rate converter is disclosed which includes a filter for processing digital data in response to a clock controlled by a clock enable signal, the filter receiving the digital data at a first sampling rate and outputting digital data at a second sampling rate. A resampler generates first selected periods of the clock enable signal having a first duty cycle approximating a ratio between the first sampling rate and the second sampling rate and, selectively, second selected periods of the clock enable signal having a second duty cycle for minimizing an error accumulated over the first selected periods of the clock enable signal.

Synchronous sample rate conversion circuits and methods embodying the inventive principles require substantially fewer filter stages and consequently can be implemented on substantially less silicon area. Moreover, such circuits and methods can be used in a wide range of synchronous applications including up-conversion (interpolation) and down-conversion (decimation). By appropriate selection of the operating parameters, fractional sample rate conversions can be accomplished.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
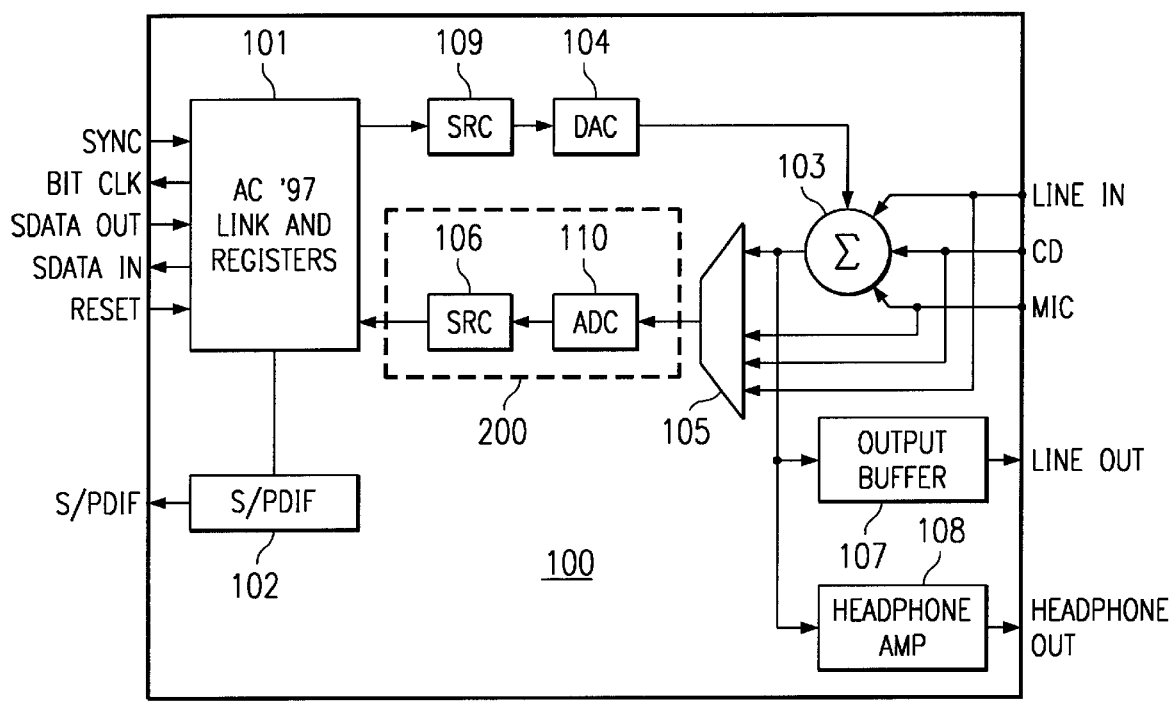
FIG. 1 is a functional block diagram of an exemplary codec suitable for describing the present inventive concepts.

FIG. 1 is a high level functional block diagram of a Codec 100 suitable for practicing the present inventive concepts. Codec 100 includes a digital AC '97 Link and associated registers 101 which support an interface with an external controller, such as a PCI bus-based controller, in accordance with the Intel Audio Codec '97 Specification, Revision 2.2. A digital output port 102 supports transmission of digital audio data to external audio appliances in accordance with the Sony-Philips Digital Interface (S/PDIF) protocol.

The analog section of Codec 100 includes a mixer 103 for mixing, as selected in register, analog audio data received from Line In, Compact Disk (CD) and Microphone (MIC) analog inputs, along with digital received through AC-Link 101 and converted into analog form by digital to analog converter (DAC) 104. Multiplexer 105 selects between analog data received directly from the analog inputs and the output of mixer 103. The selected analog stream is subsequently converted to digital form by analog to digital converter (ADC) 110 before being formatted and transmitted through AC Link 101.

The mixed analog data output from mixer 103 can also be used to drive an external device, such as amplified speakers, or headphones. Hence, an output buffer 107 and a headphone amplifier 108 are also included in the illustrated embodiment.

Sample rate converters 109 and 106 under register control, are provided to change the sampling rate of data going to and from AC '97 Link 101. For example, the AC '97 specification requires that a compliant device support both the 44.1 and 48 kHz rates. As discussed further below in details, ADC 110 and SRC 106 can be advantageously integrated into a single circuit block 200.

Figure 2A:
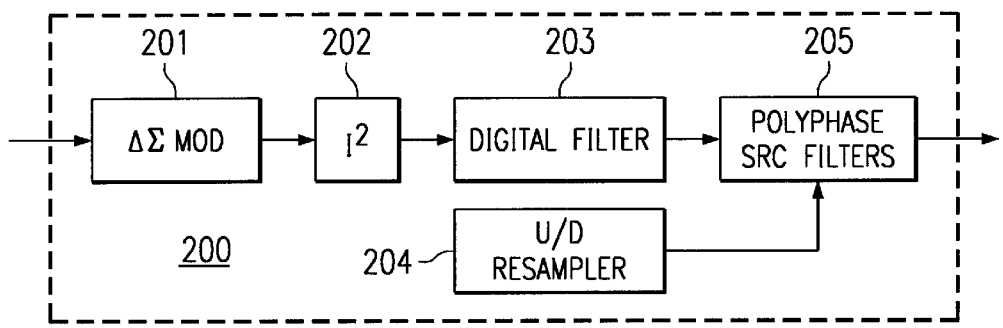
FIG. 2A is a functional block diagram of a conventional analog to digital converter—sample rate converter (ADC-SRC) subsystem.

For discussion purposes, first consider a conventional Delta-Sigma modulator-based A/D converter with sample rate conversion as shown in block 200 in FIG. 2A. In this case, the analog waveform is passed through an oversampling Delta-Sigma modulator 201 and converted to a 1-bit stream at the oversampling rate. The modulator also shapes the resulting quantization noise and generally translates that noise to a frequency band well above that of the signal interest. The modulator output is then passed through digital filters 202 and 203 which filter the 1-bit data to perform wideband anti-aliasing and decimate and convert the data to produce a stream of multiple-bit samples at a lower sampling rate.

Continuing with the conventional scheme, the multiple bit digital data then pass through polyphase SRC filters 205 under the control of up-conversion/down-conversion circuitry 204 to achieve the desired final sampling rate. Typically, during sample rate conversion these data are first upconverted, then filtered and then finally down converted such that the final sampling rate is:

$$f_{out} = U/D \cdot f_{in}$$

where U is the up-sampling factor and D is the down-sampling factor.

As should be apparent from this brief description, the traditional A/D—sample rate conversion scheme is not optimized to reduce silicon area use. This is particularly true with respects to the multiple filter stages that are required to implement the various conversion processes. Hence, one of the purposes of the present concepts to combine filtering functions to minimize the required hardware, while at the same time still allow for fractional sample rate conversion.

Figure 2B:
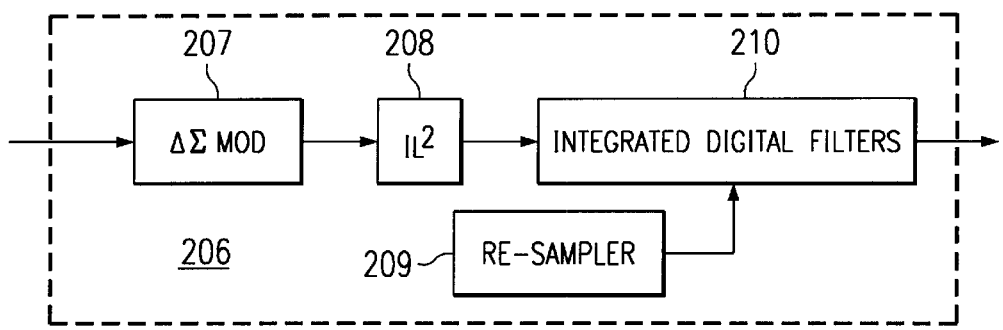
FIG. 2B is a functional block diagram of a preferred integrated analog to digital converter-sample rate converter (ADC-SRC) embodying the inventive concepts

FIG. 2B is a functional block diagram of a preferred integrated analog to digital converter—sample rate converter (ADC-SRC) 206 embodying the inventive concepts. The analog input waveform is sampled and converted into a 1-bit data stream at the selected oversampling rate by delta-sigma modulator 207. Delta-sigma modulator 207 also shapes the quantization noise as a function of the selected modulator order such that the majority of that noise is shifted to frequencies above the base-band of interest (in this case the audio band).

If the output from delta-sigma modulator 207 were to be directly resampled for sample rate conversion, high frequency noise will alias (fold-back) into the audio-band. Consequently, a filter 208 is required between the modulator output and the resampler. As discussed in detail below, filter 208 is preferably a two stage Leaky Integrator (IL$^2$) filter which filters out the high frequency noise while still remaining stable around the DC point.

The output from IL$^2$ filter 208 is then passed through an integrated digital filter (IDF) 210 which outputs multi-bit digital data at the desired new base-band rate through decimation. The decimation is controlled by resampling circuitry 209 which is described in detail below. By careful selection of IL$^2$ filter 208, the complexity and silicon area consumed by IDF 210 can be advantageously reduced. For example, for a typical audio application, the required are can be approximatelly halved.

The signal output from the modulator, including the data and the quantization noise, will be generally a repeating spectrum of relatively broad band. Therefore, in order to avoid aliasing back into the base-band after sampling, filter 208 should be a low pass filter with a narrow or very narrow pass-band. Moreover, the stop band attenuation must be substantial, for example, −80 db or more.

An IL$^2$ filter 208 is the preferred choice at the modulator output because it is the most practical design which minimizes the silicon area required. For example, finite impulse response (FIR) or infinite impulse response (IIR) filters with narrow pass-bands and high stop band-attenuation could be used; however, such filters would have to be of a very large order thereby requiring a large number of stages and consequently significantly more silicon area. Integrator stages of cascaded integrator comb (CIC) filters are another possibility; however, if a CIC is used in combination with a resampler, instabilities can occur, especially at DC since an ideal integrator has a pole at DC.

The preferred transfer function for a two-stage cascaded leaky integrator embodiment of IL$^2$ filter 208 is:

$$H(z) = \{z^{-1}/[1-(1-\delta)z^{-1}]\}^2$$

where $\delta$ is the leaky factor which is preferably a very small value, for example, $2^{-6}$. The maximum gain occurs at DC and is approximately $1/\delta$. The choice of $\delta$ is a tradeoff between hardware and filter performance; as $\delta$ increases the stop band attenuation increases but the DC gain also increases forcing a wider data path width. Advantageously, since the poles of the leaky integrator are within the unit circle, it is unconditionally stable.

Since IL$^2$ filter 208 filters out most of the high frequency components, the constraints on IDF 210 are consequently relaxed. Preferably, IDF 210 includes a decimation stage which can be implemented, for example, with a CIC filter followed by a FIR or an IIR filter. Additionally, IDF 210 also includes magnitude and/or phase compensation filters operating at the output sample rate. These compensation filters are used to compensate for any pass-band droop and/or non-linear phase shifting introduced by the leaky integrator and decimation filters.

Resampling circuitry 209 preferably implements the decimation operation by generating an enable signal controlling the clocking of data through IDF 210. Specifically, resampler 209 generates a control signal Sample_Valid with a duty cycle approximating the ratio of the output sampling rate to the input sampling rate. In other words, IDF 210 only processes samples when Sample_Valid is active and is idled when Sample_Valid is inactive. By periodically varying the duty cycle of Sample_Valid, accumulated error due to the fact that the ratio of the output sampling rate to the input sampling rate is only approximated by Sample_Valid is minimized. For example, Sample_Valid is used to drop oversampling clocks controlling one or more of the filter stages of IDF 210 to effectuate a decimation. Sample_Valid can also be used to time a zero-order hold or similar function such that an interpolation can be implemented.

Generally, an approximate (rounded) conversion factor is calculated from the ratio of the rate of the input signal to the rate of the desired output signal. Depending on the value of this ratio being closer to unity or otherwise, the objective is to calculate active and inactive clock cycles that approximate this ratio. The illustrated embodiment describes in detail the case where the ratio is close to unity. The procedure of FIG. 3 can be applied however to both cases.

A nominal duty cycle for Sample_Valid in terms of active clock cycles versus total clock cycles over a given period, with 1 inactive cycle per such period assumed, is then calculated which approximates the desired conversion factor. Since this nominal duty cycle is only approximate, if Sample_Valid is used uncorrected as the clock enable signal, an error will accumulate in the sample rate conversion process. Therefore, periodically the duty cycle of Sample_Valid is changed from the nominal to compensate for the accumulated error. Specifically, the duty cycle is stepped as required to introduce a canceling error equal in magnitude but opposite in sign to the accumulated error.

Figure 3A:
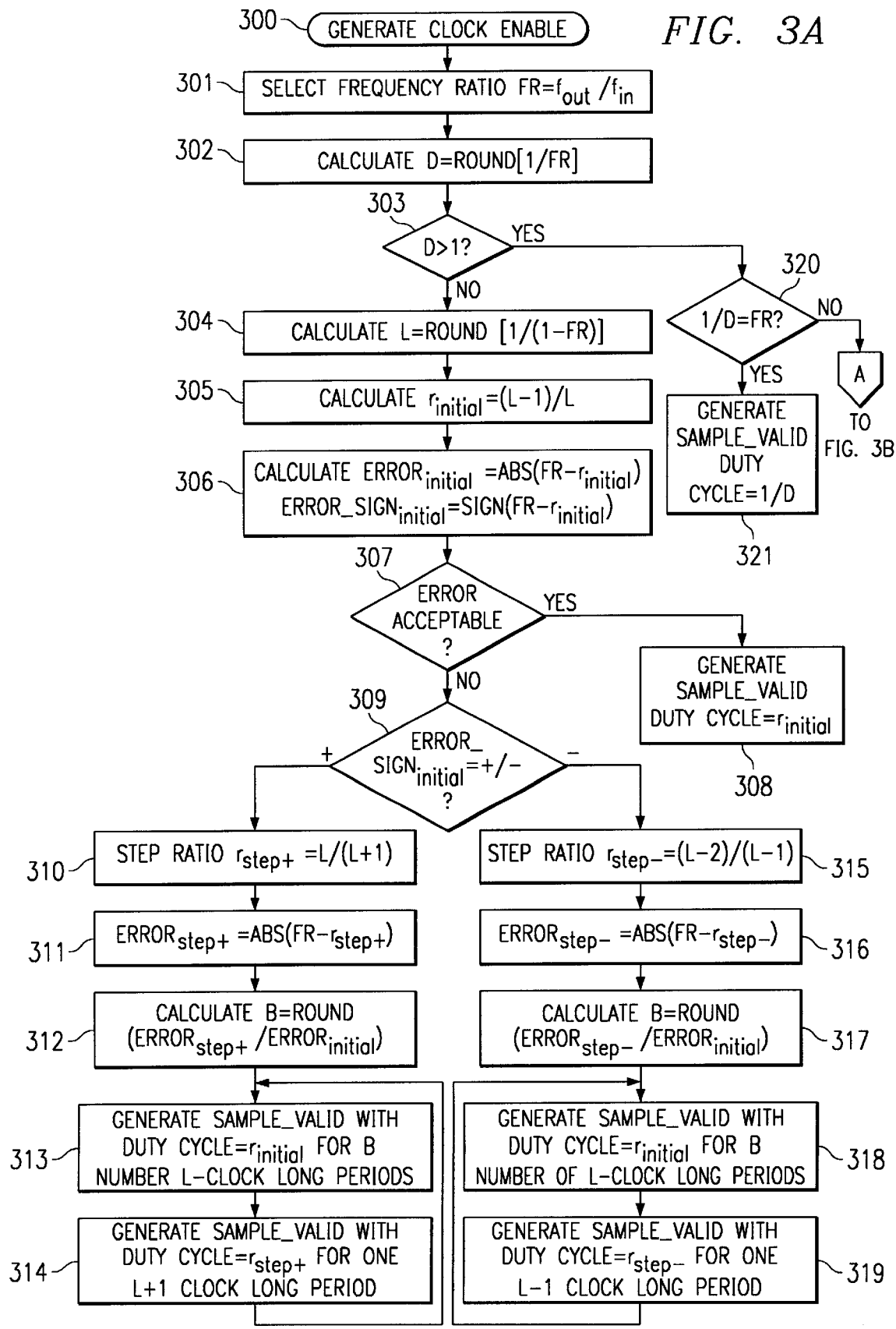
FIG. 3 is a flow chart illustrating a preferred procedure for performing synchronous re-sampling with accumulated error compensation.
Figure 3B:
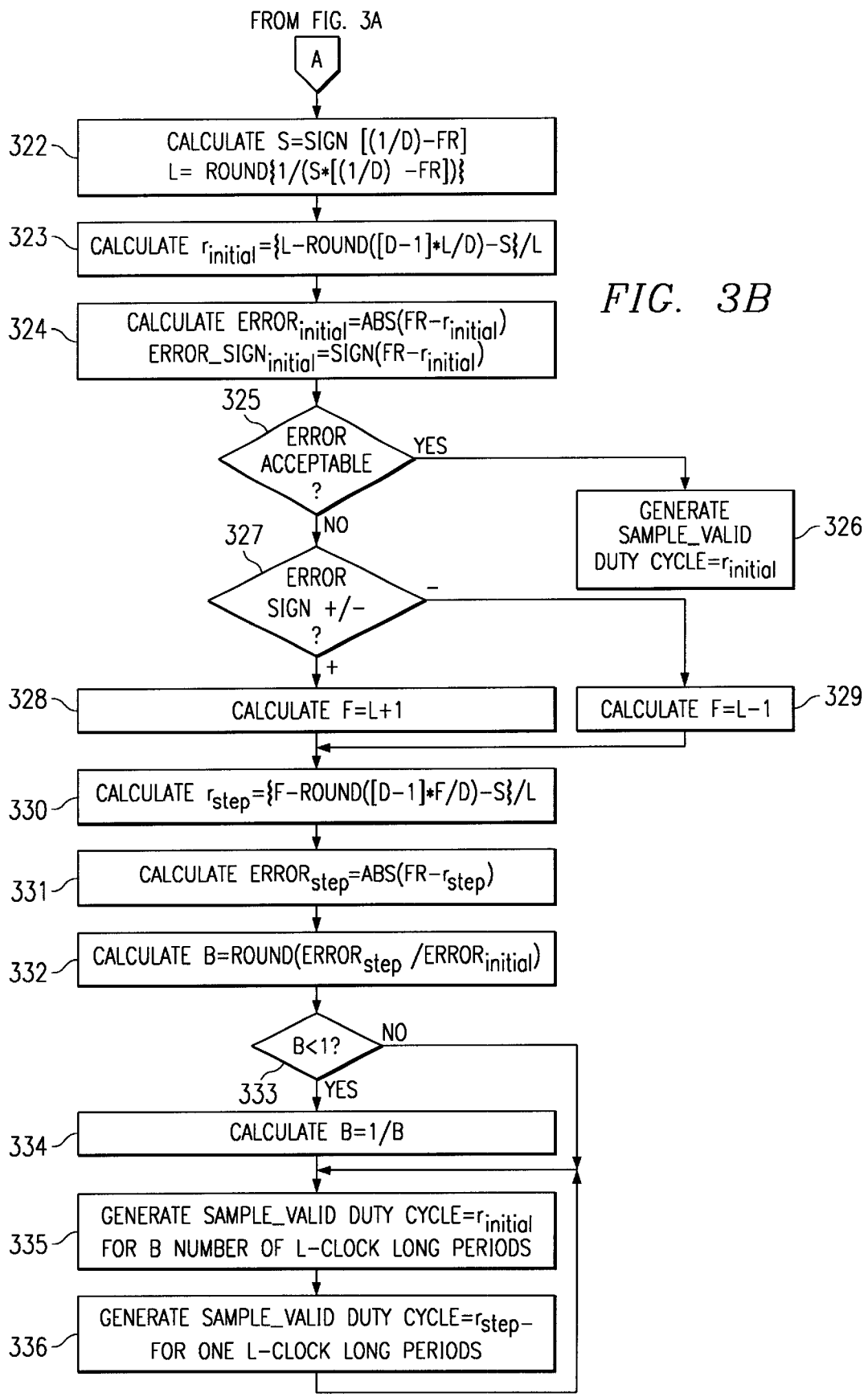

FIG. 3 is a flow chart illustrating a preferred procedure 300 for performing synchronous re-sampling, by generating Sample-Valid described above. Procedure 300 can be used either for interpolation or decimation; a basic decimation example is given below to demonstrate its application.

At Step 301, the frequency ratio (FR) of the desired output rate (frequency) to the desired input rate (frequency) is first determined. Specifically:

$$FR = f_{OUT}/f_{IN}$$

where $f_{out}$ is the frequency of the output stream and $f_{in}$ is the frequency of the input stream.

From the frequency ratio, a factor D is calculated at Step 302.

$$D = \text{round}[1/FR]$$

At step 303, a determination is made as to whether D is greater than to one. Consider first the case where D is not greater than one. In this case, the factor L is calculated at Step 304 where:

$$L = \text{round}[1/(1-FR)]$$

L helps minimize the distortion caused by the decimation process. L represents, in number of clock cycles, one period, including active and inactive cycles, over which the duty cycles is to be selected.

For each period L, one clock cycle of Sample_Valid will be inactive and the remaining clock cycles will be active. Taking into account this assumption, the initial ratio of active cycles to total clock cycles over the period L (i.e. the duty cycle) is calculated at Step 305:

$$r_{INITIAL} = (L-1)/L$$

As previously indicated, $r_{INITIAL}$ introduces a quantum of error with each period L with respects to the actual desired frequency ratio FR. This error and its sign are determined at Step 306 where:

$$\text{Error}_{INITIAL} = \text{abs}(FR - r_{INITIAL});$$

and $$\text{Error\_Sign}_{INITIAL} = \text{sign}(FR - r_{INITIAL}).$$

Over the course of B number of periods L, the accumulated error becomes:

$$\text{Error}_{ACCUMULATED} = B \cdot \text{Error}_{INITIAL}$$

If at Step 307, the error calculated at Step 306 is acceptable, then at Step 308 Sample_Valid is generated using $r_{INITIAL}$ as the duty cycle. Otherwise, the problem becomes one of selecting a value for B and a new duty cycle which can be inserted for one period after B number of L clock wide periods to introduce an error of opposite sign and magnitude to $\text{Error}_{ACCUMULATED}$.

At Step 309, the sign of the sign of initial error (Error_Sign$_{INITIAL}$), is observed. The case where Error_Sign$_{INITIAL}$ is positive will be considered first. Here, the ratio in number of active clock periods to total clock periods of Sample_Valid is stepped at Step 310;

$$r_{STEP+} = L/(L+1)$$

In the preferred embodiment, for the compensation period the number of inactive clock cycles remains fixed at one; therefore, in this case the number of active cycles is increased by 1 to L and the total number of clock in the period increased from L to L+1.

The corresponding error introduced by $r_{STEP+}$ is (Step 311):

$$\text{Error}_{STEP+} = \text{abs}(FR - r_{STEP+})$$

Consequently, a value for B is calculated at Step 312 preferably as:

$$B = \text{round}(\text{Error}_{STEP+}/\text{Error}_{INITIAL}).$$

At Steps 313 and 314, Sample_Valid is generated for a positive initial error. Specifically, Sample_Valid is generated with B number of L-clock long periods at the initial ratio (duty cycle) $r_{INITIAL}$ and the corresponding error is accumulated (Step 313). The next period is L+1 total clock periods long, with L-number of active periods and 1 inactive period, in accordance with the stepped ratio (duty cycle) $r_{STEP+}$ is (Step 314). This process is repeated to generate Sample_Valid as needed for up-converting or down-converting. A small residual error remains which is approximately:

$$\text{Error}_{RESIDUAL} = FR - [B \cdot (L-1) + L/(B \cdot L) + L+1]$$

This error will typically be small enough to be within the given specification. Similar steps are performed when Error_sign$_{INITIAL}$ is negative at Step 309. In this case, the new inactive to active ratio is calculated at Step 315 to be:

$$r_{STEP-} = (L-2)/(L-1)$$

Here, the total number of clock cycles in the period is decreased by one to L−1 and the total number of active cycles is reduced from the initial value of L−1 to L−2. The number of inactive clock cycles per total clock cycles per period in the preferred embodiment remains at 1.

The compensating error then becomes at Step 316:

$$\text{Error}_{STEP-} = \text{abs}(FR - r_{STEP-}).$$

The period number B is calculated at Step 317 as:

$$B = \text{round}(\text{Error}_{STEP-}/\text{Error}_{INITIAL}).$$

The signal Sample_Valid is generated at Steps 318 and 319. Again, B number of periods L are made at the ratio $r_{INITIAL}$ for every L−1 clock long period at the ratio $r_{STEP-}$. In this case the residual error is:

$$\text{Error}_{RESIDUAL} = FR - [B \cdot (L-1) + (L-2)/(B \cdot L) + L-1]$$

Returning to Step 303, now consider the case where 1/D=FR at subsequent Step 320. Here the estimated duty cycle D is close to the inverse of the desired frequency ration FR; therefore, at Step 321 Sample_Valid is generated with a duty cycle 1/D.

If D is greater than one, but not equal to 1/FR, at Steps 303 and 320, then the factor L and a sign value S are calculated at Step 322:

$$S = \text{sign}((1/D)-FR)$$

$$L = \text{round}(1/(S*[(1/D)-FR]))$$

The initial ratio of active clock cycles to total clock cycles $r_{INITIAL}$, is calculated at Step 323 as:

$$r_{INITIAL} = \{L - \text{round}([D-1]*L/D) - S\}/L$$

The error and error sign are calculated at Step 324 as:

$$\text{Error}_{INITIAL} = \text{abs}(FR - r_{INITIAL});$$

and $$\text{Error\_Sign}_{INITIAL} = \text{sign}(FR - R_{INITIAL}).$$

If at Step 325, the error is found to be acceptable, then Sample_Valid is generated at Step 326 with a duty cycle of $r_{INITIAL}$. Otherwise, the error sign is evaluated at Step 327.

Consider the case where the error sign is positive at Step 327. In this case, a factor F is calculated at Step 328 as:

$$F = L+1$$

On the other hand, if the error sign is negative at Step 327, then factor F is calculated at Step 329 as:

$$F = L-1$$

Once F is calculated, the ratio is stepped at Step 330, where:

$$r_{STEP} = \{F - \text{round}([D-1]*F/D) - S\}/L$$

The error is then calculated (Step 331):

$$\text{Error}_{STEP} = \text{abs}(FR - r_{STEP}).$$

The factor B is calculated in this case at Step 332 as:

$$B = \text{round}(\text{Error}_{STEP\_}/\text{Errror}_{initial})$$

A test is performed at Step 333 to determine whether B is less than 1. If it is, then B becomes 1/B at Step 334 and the process continues to Steps 335 and 336 for the generation of Sample_Valid. Otherwise, the process proceeds directly to Steps 335 and 336, where Sample_Valid is generated with a duty cycle of $r_{INITIAL}$ for B number of L-clock cycle long periods and with a duty cycle of $r_{STEP}$ for one L-clock cycle long period.

The application of procedure 300 can be demonstrated with respects to the down conversion of audio data recorded at a sampling frequency 48 kHz and a sampling frequency of 44.1 kHz for pre-playback processing. A maximum error of ±1000 ppm in the 44.1 kHz data stream is the exemplary specification value. In this case:

| | | |
|---|---|---|
| FR = | 44100/48000 = | 0.91875 |
| L = | round[1/(1 − 0.91875)] = | 12 |
| $r_{INITIAL}$ = | (12 − 1)/12 = | 0.9166 |

-continued

| | | |
|---|---|---|
| $\text{Error}_{INITIAL}$ = | 0.91875 − 0.9166 = | 0.00215 |
| $\text{Error\_Sign}_{INITIAL}$ = | | positive |
| Frequency Error = | 44100 − (0.9166 · 48000) = | 100 Hz or 2267 ppm. |

Since the error in the output frequency of 2267 ppm well exceeds the specified ±1000 ppm, and the initial error sign $\text{Error\_Sign}_{INITIAL}$ is positive, a period L with a compensation duty cycle $r_{STEP}+$ must be inserted after every B number of periods L at the ratio $r_{INITIAL}$. The exemplary calculations are as follows:

| | | |
|---|---|---|
| $r_{STEP+}$ = | 12/(12 + 1) = | 0.9230 |
| $\text{Error}_{STEP}$ = | 0.91875 − 0.9230 = | 0.00425 |
| B = | round (0.00425/0.00215) = | 2 |

Figure 4:
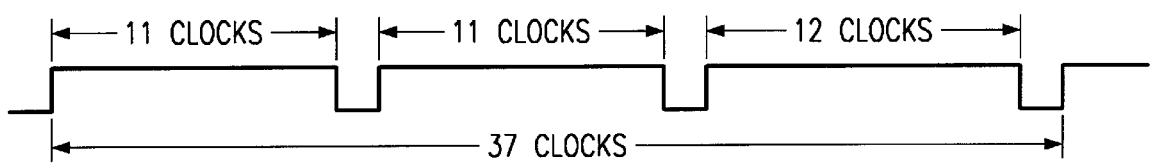
FIG. 4 is a diagram of an exemplary waveform of a control signal used to time the synchronous re-sampling operations described in FIG. 3.
Figure 5:
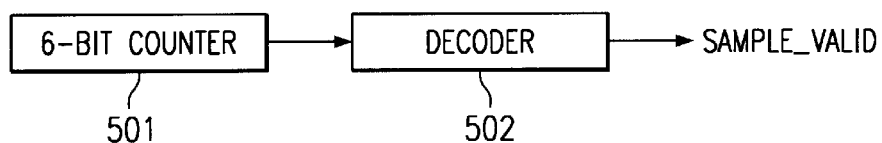
FIG. 5 is a high level functional block diagram demonstrating the generation of the waveform of FIG. 5 in hardware or software with a counter and a decoder.

The resulting waveform is then a periodic function as illustrated in FIG. 4. FIG. 5 is a high level functional block diagram demonstrating low this waveform can be generated in hardware or software with a counter 501 and a decoder 502. For this example, counter 501 counts from 0 to 36 and then wraps back to 0. Decoder 502 decodes the count to switch Sample_Valid low (inactive) for 1 clock cycle at count values of 11, 23 and 36. The error in the final frequency is well below the specified ±1000 ppm maximum

| | | |
|---|---|---|
| Ratio = | (2 · 11 + 12)/(2 · 12 + 13) = | 0.918989 |
| Frequency Error = | 44100 − (0.918989 · 48000) = | 8.1 Hz or 183 ppm |

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method of generating a timing signal controlling sample rate conversion in a system operating in response to a clock comprising the steps of:

determining an approximate conversion ratio between an output sampling rate and an input sampling rate using a smallest integer;

calculating an initial ratio of an initial number of active clock cycles to an initial total number of clock cycles to approximate the conversion ratio;

generating a selected number of periods of the timing signal of the initial ratio;

characterizing an error accumulated over the selected number of periods of the timing signal of the initial ratio; and selectively generating a period of the timing signal with a second ratio of a second number of active clock cycles to a second number total clock cycles for minimizing the accumulated error.

2. The method of claim 1 wherein said step of generating a period of the timing signal with a second ratio comprises the substeps of maintaining the initial number of inactive cycles fixed and changing the initial number of active cycles.

3. The method of claim 1 wherein said step of generating a period of the timing signal with a second ratio comprises the substep of changing the initial total number of clock cycles.

4. The method of claim 1 wherein an initial number of inactive clock cycles of the initial length of the period of the timing signal is set at one.

5. The method of claim 1 and further comprising the step of selecting the number of periods of the timing signal of the initial ratio, comprising the steps of:

calculating a first error between the conversion ratio and the initial ratio;

calculating an second error between the conversion ratio and the second ratio; and selecting the number of periods of the timing signal by rounding a ratio of the second error to the first error.

6. The method of claim 1 wherein said step of characterizing comprises the substeps of:

determining an error magnitude; and determining an error sign.

7. The method of claim 6 wherein the error sign is positive and said step of generating a period of the timing signal with a second ratio comprises the substeps of:

increasing the initial number of active clock cycles by one; and increasing the initial total number of clock cycles by one.

8. The method of claim 6 wherein the error sign is negative and said step of generating a period of the timing signal with a second ratio comprises the substeps of:

decreasing the initial number of active clock cycles by one; and decreasing the initial total number of clock cycles by one.

9. A method of converting a stream of data from a first frequency to a second frequency comprising the steps of:

calculating a frequency ratio of the second frequency to the first frequency;

calculating an initial timing signal with a duty cycle approximating the frequency ratio;

calculating a first error between the initial duty cycle and the frequency ratio, the error having a magnitude and sign;

stepping the duty cycle in response to the sign of the error;

calculating a second error between the stepped duty cycle and the frequency ratio, the second error having a magnitude;

calculating a number of cycles of the timing signal at the initial duty cycle per cycle of the timing signal at the stepped duty cycle as a function of a ratio of the magnitude of the second error to the magnitude of the first error;

generating the timing signal with the calculated number of cycles at the initial duty cycle and selectively one cycle at the stepped duty cycle; and converting the stream of data from the first frequency to the second frequency by selectively enabling a filter in response to the timing signal.

10. The method of claim 9 wherein said step of converting comprises the step of enabling a clock signal timing the operation of the filter with the timing signal.

11. The method of claim 9 wherein said step of converting comprises the step of selectively enabling the filter to perform a decimation.

12. The method of claim 9 wherein said step of converting comprises the step of selectively enabling the filter to perform an interpolation.

13. The method of claim 9 wherein the sign of the first error is positive and said step of stepping the duty cycle comprises the step of increasing the duty cycle.

14. The method of claim 9 wherein the sign of the first error is negative and said step of stepping the duty cycle comprises the step of decreasing the duty cycle.

15. The method of claim 9 wherein said step of calculating a initial timing signal duty cycle comprises the substep of calculating a ratio between a number of active clock cycles to a total number of active and inactive clock cycles per timing signal cycle, wherein the number of inactive cycles per timing signal cycle is one.

16. A sample rate converter comprising:

a filter for processing digital data in response to a clock controlled by a clock enable signal, the filter receiving the digital data at a first sampling rate and outputting the digital data at a second sampling; and resampler circuitry operable to generate first selected periods of said clock enable signal having a first duty cycle approximating a ratio between the first sampling rate and the second sampling rate and selectively second selected periods of said clock enable signal having a second duty cycle for minimizing an error accumulated over said first selected periods of said clock enable signal, wherein said error is positive and said second duty cycle is greater than said first duty cycle.

17. The sample rate converter of claim 16 wherein said filter performs a decimation.

18. The sample rate converter of claim 16 wherein said filter performs an interpolation.

19. A sample rate converter comprising:

a filter for processing digital data in response to a clock controlled by a clock enable signal, the filter receiving the digital data at a first sampling rate and outputting the digital data at a second sampling; and resampler circuitry operable to generate first selected periods of said clock enable signal having a first duty cycle approximating a ratio between the first sampling rate and the second sampling rate and selectively second selected periods of said clock enable signal having a second duty cycle for minimizing an error accumulated over said first selected periods of said clock enable signal, wherein said error is negative and said second duty cycle is less than said first duty cycle.

20. The sample rate converter of claim 19 wherein said filter performs a decimation.

21. The sample rate converter of claim 19 wherein said filter performs an interpolation.

* * * * *